(12) United States Patent
Ono et al.

(10) Patent No.: US 10,014,457 B2
(45) Date of Patent: Jul. 3, 2018

(54) LIGHT EMITTING DEVICE

(71) Applicant: NICHIA CORPORATION, Anan-shi (JP)

(72) Inventors: Masato Ono, Sagamihara (JP); Daisuke Kishikawa, Anan (JP); Toshihiko Aizawa, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 13 days.

(21) Appl. No.: 15/387,675

(22) Filed: Dec. 22, 2016

(65) Prior Publication Data
US 2017/0186928 A1  Jun. 29, 2017

(30) Foreign Application Priority Data
Dec. 25, 2015 (JP) ................. 2015-254797

(51) Int. Cl.
| | |
|---|---|
| *H01L 29/18* | (2006.01) |
| *H01L 33/62* | (2010.01) |
| *H01L 27/15* | (2006.01) |
| *H01L 33/54* | (2010.01) |
| *H01L 33/56* | (2010.01) |

(Continued)

(52) U.S. Cl.
CPC .......... *H01L 33/62* (2013.01); *H01L 25/0753* (2013.01); *H01L 27/156* (2013.01); *H01L 33/54* (2013.01); *H01L 33/56* (2013.01); *H01L 33/58* (2013.01); *H01L 2224/48095* (2013.01); *H01L 2224/49111* (2013.01)

(58) Field of Classification Search
CPC ......... H01L 33/62; H01L 33/54; H01L 33/56; H01L 33/58; H01L 25/0753; H01L 27/156; H01L 2224/48095; H01L 2224/49111
See application file for complete search history.

(56) References Cited

U.S. PATENT DOCUMENTS

| | | | |
|---|---|---|---|
| 9,728,690 B2* | 8/2017 | Ukawa .................. | H01L 33/507 |
| 2007/0114558 A1* | 5/2007 | Lam ......................... | F21K 9/00 257/100 |

(Continued)

FOREIGN PATENT DOCUMENTS

| | | |
|---|---|---|
| JP | 63-276287 | 11/1988 |
| JP | 07-050800 | 2/1995 |

(Continued)

*Primary Examiner* — Mark Tornow
(74) *Attorney, Agent, or Firm* — Mori & Ward, LLP

(57) ABSTRACT

A light emitting device includes light emitting elements. A substrate includes electrically conductive layers each having a first region in which the light emitting elements are arranged and a second region connected to the first region and provided at a position higher than the first region. An electrically conductive wire electrically connects the light emitting elements arranged on the electrically conductive layer and the second region of the adjacent electrically conductive layer. A resin molded portion is formed of a light-transmissive resin that seals the light emitting elements and the electrically conductive wire. The resin molded portion has a shape in which centrally projected cylindrical lens portions is aligned, and in each of the cylindrical lens portions, the light emitting elements is arranged in a line shape. The second region is arranged between the light emitting elements in the light emitting element array.

17 Claims, 10 Drawing Sheets

(51) Int. Cl.
*H01L 33/58* (2010.01)
*H01L 25/075* (2006.01)

(56) References Cited

U.S. PATENT DOCUMENTS

2007/0257335 A1* 11/2007 O'Brien ................ H05K 1/053
257/618
2008/0290352 A1* 11/2008 Park ........................ H01L 33/60
257/89

FOREIGN PATENT DOCUMENTS

| JP | 2000-037901 | 2/2000 |
| JP | 2009-224411 | 10/2009 |
| JP | 2009-239116 | 10/2009 |
| JP | 2013-65847 | 4/2013 |
| WO | WO 2013/031987 | 3/2013 |

* cited by examiner ative only
LIGHT EMITTING DEVICE

CROSS-REFERENCE TO RELATED APPLICATIONS

This application claims priority under 35 U.S.C. § 119 to Japanese Patent Application No. 2015-254797 filed on Dec. 25, 2015. The entire disclosure of Japanese Patent Application No. 2015-254797 is hereby incorporated herein by reference.

BACKGROUND

1. Field of the Invention

The present disclosure relates to a light emitting device.

2. Description of Related Art

A light emitting device of chip-on-board (COB) type with a light emitting element is known. In one kind of COB type light emitting device, a plurality of light emitting elements are arrayed on a mounting substrate, and as one example, lower surface electrodes of the light emitting elements are electrically connected to an electrically conductive layer on the mounting substrate, and upper surface electrodes of the light emitting elements are electrically connected to the electrically conductive layer on the mounting substrate by wire bonding.

Here, by raising the electrically conductive layer that is bonded to an electrically conductive wire as shown in Japanese Patent Application Publication No. S63-276287, a step between the upper surface of the light emitting element and the upper surface of the electrically conductive layer which form a bonding portion with the electrically conductive wire can be eliminated to reduce disconnection of the electrically conductive wire and improve working efficiency of wire bonding.

In the case of a light emitting device of COB type, desired light distribution characteristics can be imparted to the light emitting device by providing a sealing member formed by linking a plurality of semicylinder-shaped cylindrical lens portions made of resin in such a manner that the cylindrical lens portions cover light emitting element arrays.

SUMMARY

According to one aspect of the present invention, a light emitting device includes a plurality of light emitting elements, a substrate, an electrically conductive wire, and a resin molded portion. The substrate includes a plurality of electrically conductive layers each having a first region in which the light emitting elements are arranged, and a second region connected to the first region and provided at a position higher than the first region. The electrically conductive wire electrically connects the light emitting elements arranged on the electrically conductive layer and the second region of the adjacent electrically conductive layer. The resin molded portion is formed of a light-transmissive resin that seals the light emitting elements and the electrically conductive wire on the substrate. The resin molded portion has a shape in which a plurality of centrally projected cylindrical lens portions is aligned, and in each of the cylindrical lens portions, the plurality of light emitting elements is arranged in a line shape to form a light emitting element array. The second region is arranged between the light emitting elements in the light emitting element array.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
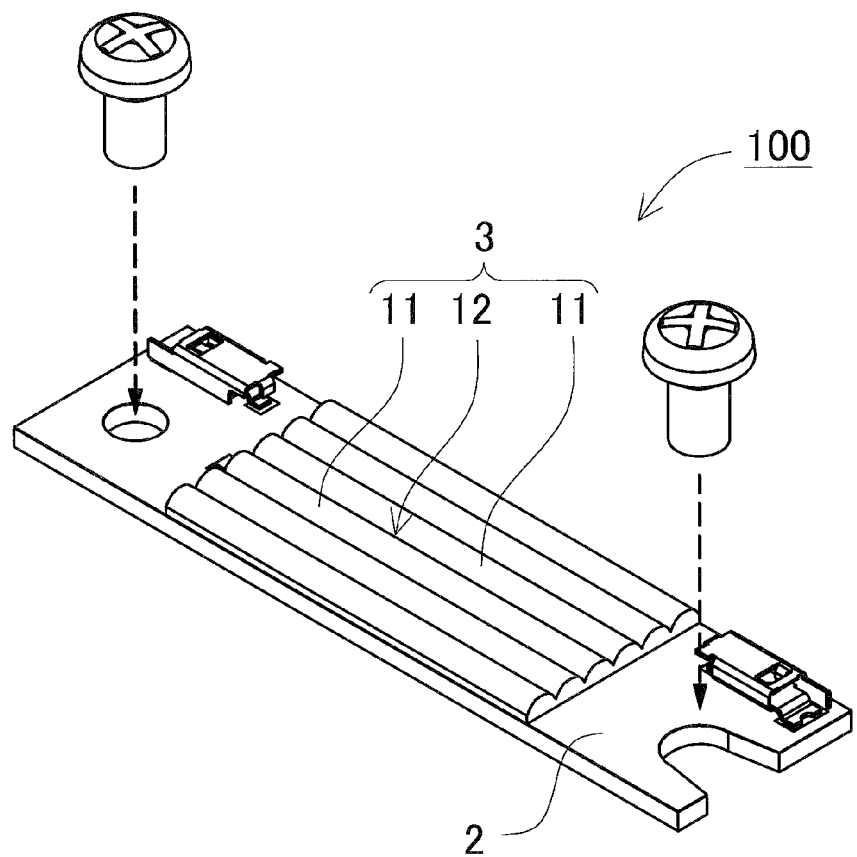
FIG. 1 is a schematic perspective view showing a light emitting device according to a first embodiment.

Hereinafter, embodiments of the present invention will be described with reference to the drawings, wherein like reference numerals designate corresponding or identical elements throughout the various drawings. The embodiments shown below are illustrative of implemented technical concepts of the present invention, and the present invention is not limited to these embodiments. In this specification, members shown in claims are not limited to those in the embodiments. The dimensions, materials and shapes of components described in the embodiments, relative arrangements thereof and so on are not intended to limit the scope of the present invention thereto, and are illustrative only unless particularly specified. The sizes, positional relations and so on of members shown in the drawings may be exaggerated for clarification of explanation. Further, in the descriptions below, like names and symbols denote like or homogeneous members, and detailed descriptions thereof are appropriately omitted. Further, for elements constituting the embodiments of the present invention, a plurality of elements may be formed by the same member so that one member serves as a plurality of elements, or conversely, the function of one member can be achieved by a plurality of members in cooperation. Matters described in some of examples or embodiments may be usable in other examples, embodiments or the like.

First Embodiment

Figure 2:
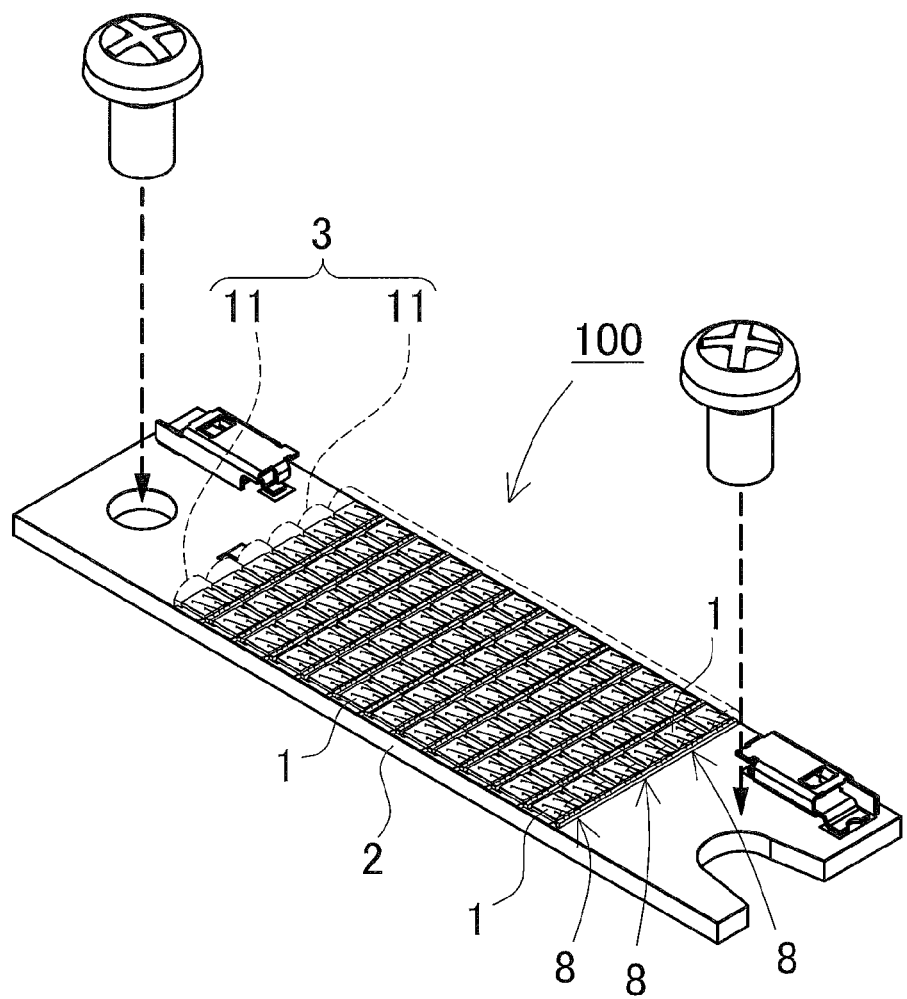
FIG. 2 is a schematic perspective view of the inside of the light emitting device in FIG. 1.
Figure 3:
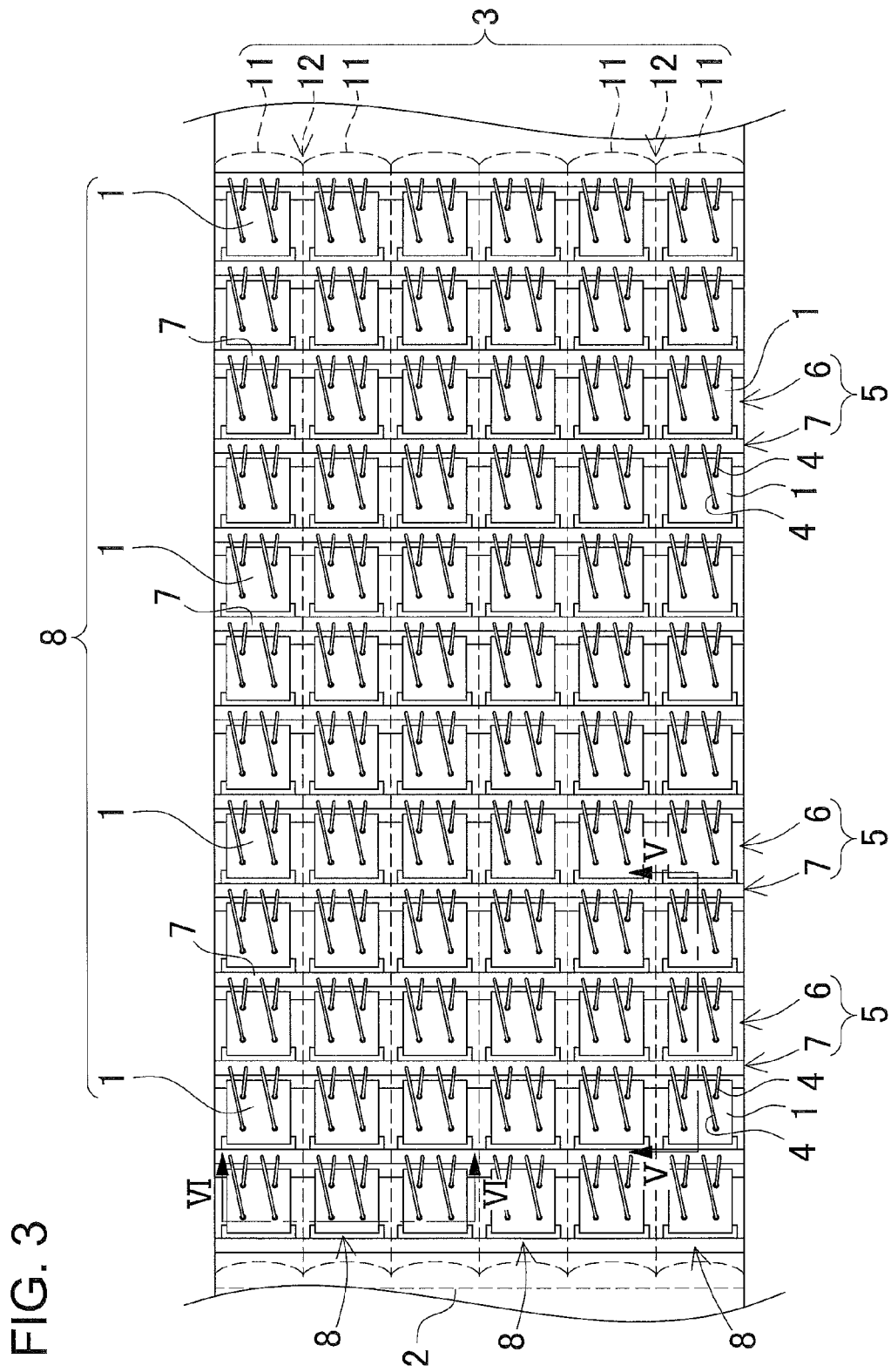
FIG. 3 is a schematic plan view of an array of a plurality of light emitting elements of the light emitting device in FIG. 1.
Figure 4:
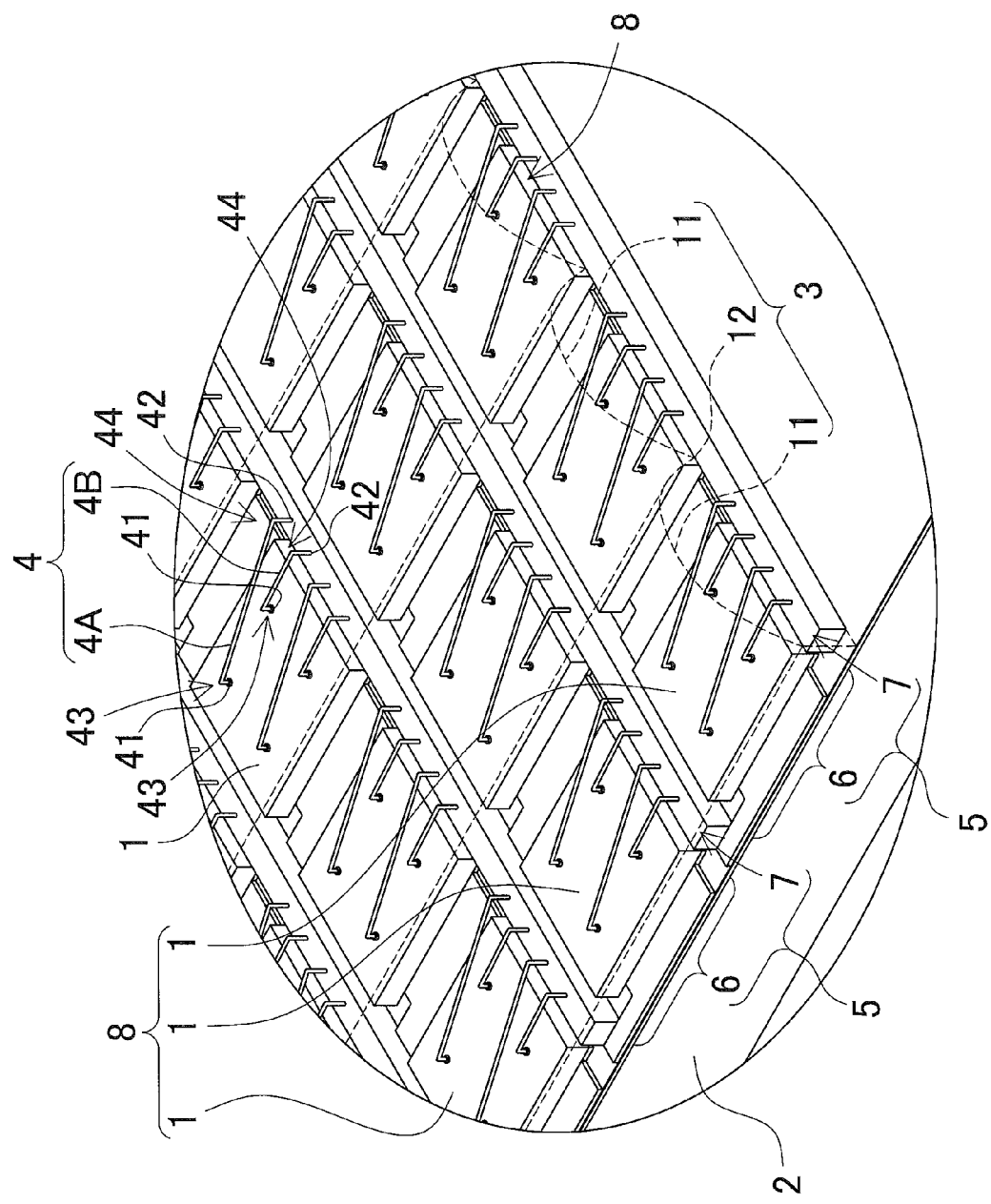
FIG. 4 is a schematic enlarged perspective view of the light emitting device in FIG. 2.
Figure 5:
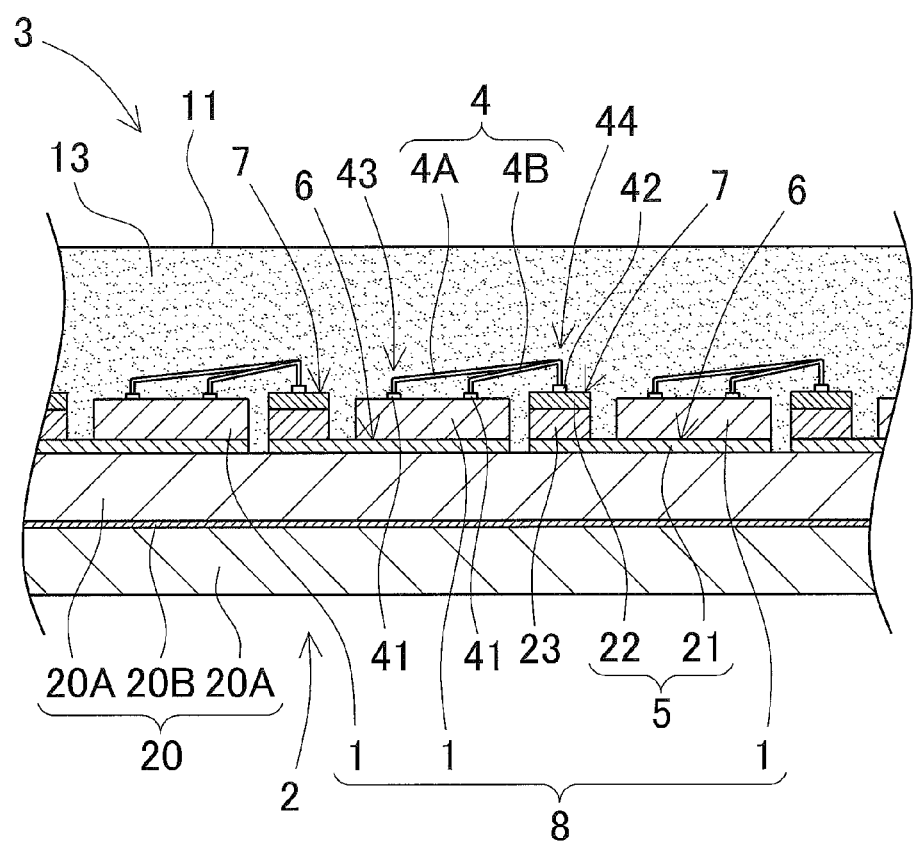
FIG. 5 is a schematic sectional view taken along line V-V in FIG. 3.
Figure 6:
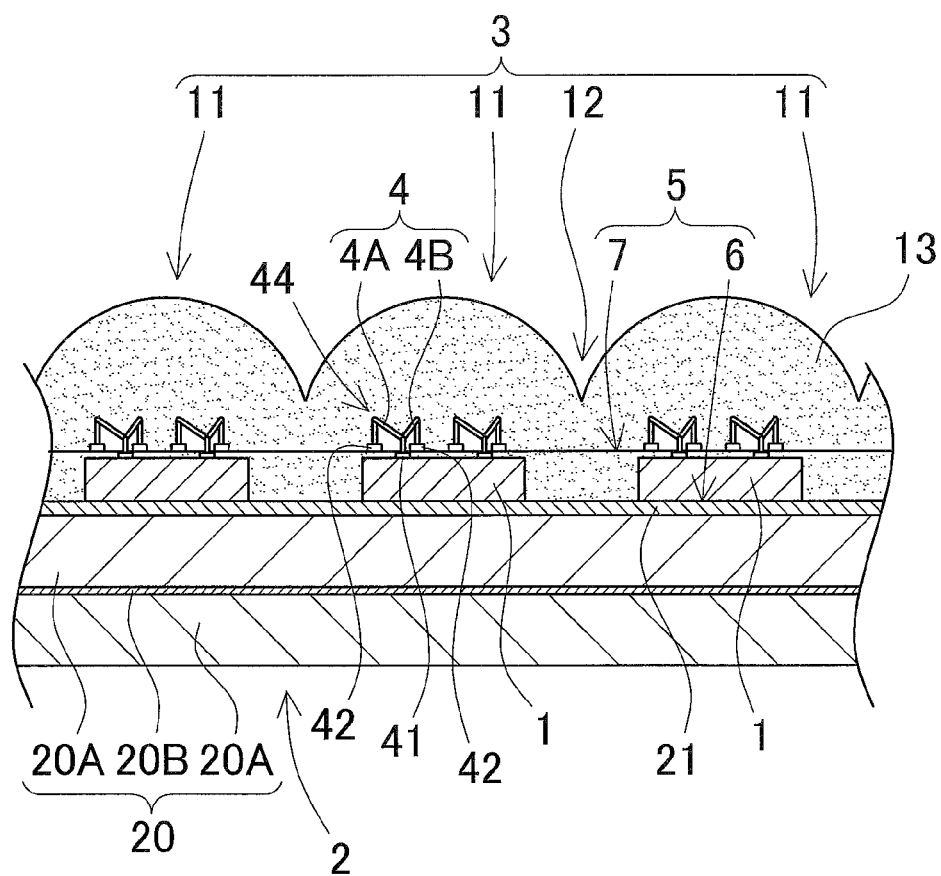
FIG. 6 is a schematic sectional view taken along line VI-VI in FIG. 3.

A light emitting device according to a first embodiment 1 is shown in FIGS. 1 to 6. Among these drawings, FIG. 1 is a schematic perspective view of the light emitting device; FIG. 2 is a schematic perspective view of the inside of the light emitting device; FIG. 3 is a schematic plan view showing an array of a plurality of light emitting elements; FIG. 4 is an schematic enlarged perspective view of the light emitting device in FIG. 4; FIG. 5 is a schematic sectional view taken along line V-V in FIG. 3; and FIG. 6 is a schematic sectional view taken along line VI-VI in FIG. 3.

The light emitting device 100 shown in these drawings includes a plurality of light emitting element 1, a substrate 2 on which a plurality of light emitting elements 1 is mounted, and a plurality of electrically conductive layers 5 formed on the substrate 2. Each of the electrically conductive layer 5 includes a first region 6 in which the light emitting elements 1 are arranged, and a second region 7 which is connected to the first region 6 and which is disposed at a position higher than the first region 6. Further, in the light emitting device 100, each of the light emitting elements 1 is electrically connected by an electrically conductive wire 4 to the second region 7 of the electrically conductive layer 5 adjacent to the electrically conductive layer 5 including the first region 6 in which the light emitting elements 1 are arranged. A plurality of light emitting elements 1 arranged on the substrate 2, and the electrically conductive wires 4 are sealed with a resin molded portion 3 formed of a light-transmissive resin 13. The resin molded portion 3 has a shape in which a plurality of centrally projected cylindrical lens portions 11 are aligned, and each cylindrical lens portion 11 is provided with a light emitting element array 8 in which a plurality of light emitting elements 1 are arranged in a line along an extending direction thereof. The resin molded portion 3 also includes groove portions 12 being a linkage portion with two of the cylindrical lens portion 11 in plan view. In this embodiment, the second region 7 is arranged between the light emitting elements 1 in the light emitting element array 8, and therefore has a smaller region overlapping a groove portion 12 as compared to a case where the second region 7 is arranged between the light emitting element arrays 8.

When the light emitting device has a configuration as described above, an area where the groove portion 12 in which the light-transmissive resin 13 has a reduced thickness and the bonding portion between the electrically conductive wire 4 and the second region 7 overlap each other in plan view can be reduced. Thus, stress applied to the bonding portion between the electrically conductive wire 4 and the second region 7 by expansion of the light-transmissive resin 13 and pressure from outside can be reduced, so that disconnection of the electrically conductive wire 4 can be reduced.

Hereinafter, the configuration and the members of light emitting device 100 will be described in detail.

Light Emitting Element 1

For the light emitting element 1, a semiconductor light emitting element such as a light emitting diode or a semiconductor laser can be suitably used. As the semiconductor light emitting element, one has a nitride semiconductor is suitably used. By selection of a material of a semiconductor layer and a mixed crystal ratio thereof, a light emission wavelength of the semiconductor light emitting element can be selected from various wavelengths ranging from those of ultraviolet light to those of infrared light. Particularly, a nitride semiconductor is preferably selected as a material of a light emitting element which emits green, blue and violet light with a high luminance. For example, $In_XAl_YGa_{1-X-Y}N$ ($0 \leq X \leq 1$, $0 \leq Y \leq 1$, $X+Y \leq 1$), or the like can be used as a material of a light emitting layer. In this embodiment, for example, a light emitting diode which emits ultraviolet light can be used as the light emitting element. The light emitting element may have a light emission wavelength of 350 nm to 420 nm, for example a light emission wavelength of 365 nm.

The light emitting element 1 includes electrodes on the upper surface and the lower surface, and the lower surface electrode is connected to the electrically conductive layer 5 on the substrate 2 as shown in FIGS. 5 and 6. By the electrically conductive wire 4, the upper surface electrode of the light emitting element 1 is brought into electrical conduction with the electrically conductive layer 5 adjacent to the electrically conductive layer 5 to which the lower surface electrode is connected. The light emitting element 1 shown in FIG. 4 has four pad electrodes provided on the upper surface, and these pad electrodes are connected to four electrically conductive wires 4, but any number of pad electrodes provided on the upper surface can be provided as long as at least one pad electrode is provided.

The light emitting element 1 shown in FIG. 4 has a rectangular shape as a shape in plan view. A square is preferable as an example of the rectangular shape. However, the plane shape of the light emitting element may be other shape such as, for example, a polygonal shape, a circular shape or an elliptical shape. The size and the thickness of the light emitting element 2 can be appropriately selected. As the light emitting element 1, for example, one having a size of 1.4 mm×1.4 mm in plan view and a thickness of 0.3 mm can be used.

In the illustrated light emitting device 100, a plurality of light emitting elements 1 are arranged in a matrix shape such that the light emitting elements 1 are arranged in a line to form the light emitting element array 8 for each cylindrical lens portion 11, and a plurality of light emitting elements 8 are arranged. In an example shown in FIGS. 2 and 3, the light emitting device includes 72 light emitting elements 1, and these light emitting elements 1 are arrayed in a matrix shape in 12 rows and 6 columns. Further, a plurality of light emitting elements 1 is connected to the electrically conductive layers 5 in series in multiple lines and in parallel in multiple lines through the electrically conductive wire 4. In the light emitting device shown in FIG. 3, light emitting elements arrayed in 12 rows and 6 columns are connected in series in 12 lines and in parallel in 6 lines. However, a light emitting device in which any number of light emitting elements are mounted with any arrangement pattern can be used, and for example, the number of longitudinal and lateral lines (the number of rows and columns) can be changed.

In this specification, the direction in which a plurality of light emitting elements 1 is connected in series in multiple lines is a first direction, and the direction in which a plurality of light emitting elements 1 is connected in parallel in multiple lines is a second direction. In the light emitting device 100 in the first embodiment, the light emitting element array 8 is formed by 12 light emitting elements 1 arrayed in a line shape in the first direction, and 6 light emitting element arrays 8 are arranged in the second direction. Further, in the light emitting device 100 of the first embodiment, 6 columns of cylindrical lens portions 11 are formed in such a manner that the cylindrical lens portions 11 are situated on each light emitting element array 8.

Substrate 2

The substrate 2 includes a base substrate 20 serving as a base for mounting a plurality of light emitting elements 1, and electrically conductive layers 5 for supplying currents to a plurality of light emitting elements 1 are formed on the upper surface of the base substrate 20. On the substrate 2, a plurality of light emitting elements 1 is mounted in a predetermined array while the electrically conductive layer 5 provided on the base substrate 20 is interposed between the light emitting elements 1, and a plurality of mounted light emitting elements 1 is covered with the resin molded portion 3 formed of the light-transmissive resin 13. Further, in the illustrated substrate 2, a linkage portions are provided at both ends, and the light emitting device can be fixed via a fixture disposed on the linkage portions.

Electrically Conductive Layer 5

The substrate 2 shown in FIGS. 3 and 4 includes a plurality of electrically conductive layers 5, and these electrically conductive layers 5 are arranged in parallel in the first direction so as to be separated from one another. The illustrated substrate 2 includes a plurality of electrically conductive layers 5 in the first direction, with the electrically conductive layers 5 extending in the second direction. On the substrate 2, the light emitting elements 1 mounted on each electrically conductive layer 5 are electrically connected to the adjacent electrically conductive layer 5 through the electrically conductive wire 4, and a plurality of rows of light emitting elements 1 arrayed in the first direction is connected in series. In the illustrated light emitting device 100, a plurality of light emitting elements 1 is connected in series in 12 lines, and therefore 12 electrically conductive layers 5 are provided in the first direction.

Each electrically conductive layer 5 includes the first region 6 in which the light emitting elements 1 are arranged, and the second region 7 which is connected to the first region 6 and which is provided at a position higher than the first region 6. The first region 6 has the light emitting elements 1 mounted on the upper surface, and is in electrical conduction with the lower surface electrodes of the light emitting elements 1. On the other hand, the second region 7 is electrically connected through the electrically conductive wire 4 to the light emitting elements 1 arranged in the first region 6 of the adjacent electrically conductive layer 5. When the second region 7 is formed with a height almost equal to that of the light emitting element 1, a step between the second region 7 and the upper surface of the light emitting element 1 can be reduced to lower the height of the electrically conductive wire 4, and therefore stress applied to the electrically conductive wire 4 due to expansion of resin by heat applied during formation of the light-transmissive resin 13 and during use of the light emitting device, and pressure from the outside can be reduced. Preferably, the second region 7 is made substantially flush with the upper surface of the light emitting element 1. However, the second region 7 can have a height greater than that of the upper surface of the light emitting element 1. The second region 7 shown in FIGS. 5 and 7 has a height slightly greater than that of the upper surface of the light emitting element 1. When the height of the light emitting element 1 is about 0.3 mm, the second region 7 may have a height greater by 0.1 mm to 0.2 mm than that of the light emitting element 1. Accordingly, wiring work of the electrically conductive wire 4 can be efficiently performed. The upper surface of the second region 7 has a height greater than that of the upper surface of the light emitting element 1 in FIGS. 5 and 7, but it may have a height less than that of the upper surface of the light emitting element 1.

In a plurality of electrically conductive layers 5 in the first embodiment, mutually adjacent electrically conductive layers 5 are connected to each other in series through light emitting elements arranged in the first region 6 of one electrically conductive layer 5, and the electrically conductive wire 4 connected to the second region 7 of the other electrically conductive layer 5. Specifically, the lower surface electrodes of the light emitting elements 1 are electrically connected to the first region 6 of one electrically conductive layer 5, and the electrically conductive wire 4 connected to the upper electrodes of the light emitting elements are electrically connected to the second region 7 of the adjacent electrically conductive layer 5, so that mutually adjacent electrically conductive layers 5 are connected to each other in series through the light emitting elements 1 and the electrically conductive wire 4.

In the electrically conductive layer 5 shown in FIGS. 3 and 4, the first region 6 is provided in a belt shape so as to extend in the array direction of the light emitting element arrays 8, i.e. in the second direction. The second region 7 is connected to the first region 6, and provided so as to extend between the light emitting elements 1 in the light emitting element array 8, i.e. in the second direction. In the electrically conductive layer 5 shown in FIGS. 3 and 4, the second region 7 is provided along one lateral edge (on the right in the drawings) of the first region 6. In the illustrated electrically conductive layer 5, the second region 7 is provided so as to continuously extend in a direction crossing, more specifically orthogonally crossing the light emitting element array 8. The second region 7 shown in FIGS. 3 and 4 are arranged so as to extend over a plurality of light emitting element arrays 8. When the second region 7 formed with a height greater than that of the first region 6 is integrally formed in this way, formation of the electrically conductive layer 5 can be facilitated.

A plurality of electrically conductive layers 5 are arranged in such a manner that in mutually adjacent electrically conductive layers 5, the first region 6 of one electrically conductive layer and the second region 7 of the other electrically conductive layer face each other, and a plurality of first regions 6 and second regions 7 are alternately arranged. Accordingly, in the first direction, the second region 7 is arranged so as to extend between light emitting elements mounted in the first region 6. In the illustrated belt-shaped first region 6, six light emitting elements 1 are mounted at predetermined intervals along the second direction, and six light emitting elements 1 mounted on one electrically conductive layer 5 are connected in parallel.

The above-described electrically conductive layer 5 has light emitting elements 1 mounted on the upper surface of the first region 6. The illustrated light emitting element 1 includes electrodes on both the upper and lower surfaces, and an electrically conductive adhesive is used as a bonding member for connecting the lower surface electrode of the light emitting element 1 to the electrically conductive layer 5. An electrically conductive paste of silver, gold, palladium or the like can be used as the electrically conductive adhesive to perform die bonding. Preferably, the light emitting element 1 is bonded on the first region 6 at a distance of 0.1 mm to 0.2 mm from the second region 7 in plan view. Accordingly, the light emitting element 1 and the second region 7 hardly come into contact with each other, so that high reliability can be imparted to the light emitting device 100.

For the substrate 2 including a plurality of electrically conductive layers 5 each including the first region 6 and the second region 7 as described above, mention can be made of the following substrate. The substrate 2 shown in FIGS. 5 and 6 includes the base substrate 20 in which two insulating plates 20A are laminated with an intermediate metal layer 20B provided therebetween. In the illustrated base substrate 20, for example, the insulating plate 20A may be made of ceramic (more specifically, AlN), and the intermediate metal layer 20B may be made of copper. Further, in the substrate 2, a metal layer is provided on the base substrate 20 to form the electrically conductive layer 5. In the illustrated substrate 2, a first electrically conductive layer 21 composed of a metal layer is formed on the upper surface of the base substrate 20, an insulating layer 23 is partially provided on the upper surface of the first electrically conductive layer 21, and a second electrically conductive layer 22 composed of a metal layer is formed on the upper surface of the insulating layer 23 to form the second region 7. A region of the first electrically conductive layer 21, which is exposed from the insulating layer 23 and which is not provided with the second region 7 in plan view, is the first region 6. The first electrically conductive layer 21 and the second electrically conductive layer 22 may be, for example, metal layers made of copper, and for the insulating layer 23, ceramic (AlN) can be used as with the insulating plate 20A. The first electrically conductive layer 21 and the second electrically conductive layer 22 of one electrically conductive layer 5 are electrically connected to each other through a via provided on the insulating layer 23. Use of the substrate 2 having such a configuration is preferable because heat dissipation characteristics can be improved, and a substrate which is hardly warped by heat etc. can be obtained.

Figure 7:
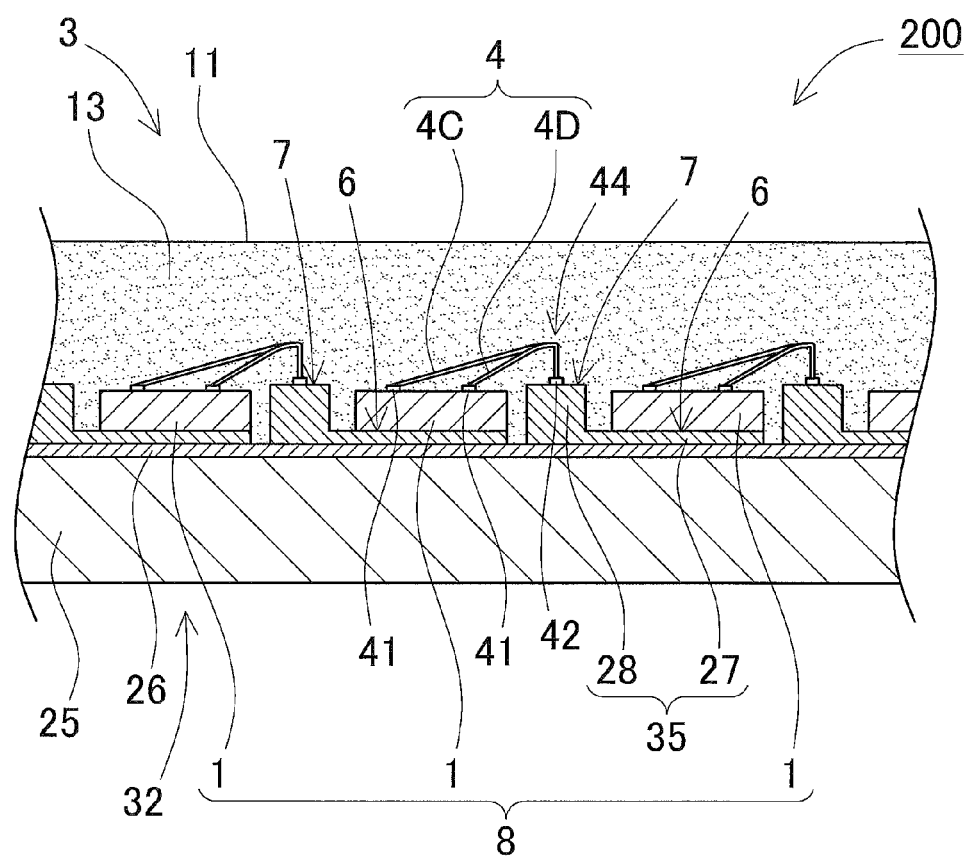
FIG. 7 is a schematic sectional view showing other forms of a substrate.

Further, a substrate 32 of a light emitting device 200 as shown in FIG. 7 may be used. In the substrate 32 shown in FIG. 7, an insulating layer 26 is provided on the upper surface of a base substrate 25 made of metal, and a metal layer 27 is provided on the insulating layer 26 to form an electrically conductive layer 35. A metal plate being the base substrate 25 may be, for example, a copper plate. The metal layer 27 formed on the insulating layer 26 can be formed from a metal film formed by plating. The metal film may be, for example, a copper-plated film. In the electrically conductive layer 35, the metal layer 27 is set as the first region 6 on which the light emitting elements 1 are disposed. Further, the electrically conductive layer 35 shown in FIG. 7 is provided with a thick portion 28 in which a part of the metal layer 27 is made thicker than the first region 6, and the thick portion 28 is set as the second region 7 to which the electrically conductive wire 4 is bonded. The thick portion 28 that is the second region 7 can be easily formed by thickly forming the metal plate by plating. When the second region 7 is composed of the thick portion 28 in which a part of the metal layer 27 is made thick, dissipation characteristics can be improved.

Electrically Conductive Wire 4

The electrically conductive wire 4 electrically connects the upper surface electrode of the light emitting element 1, which is mounted in the first region 6 of the electrically conductive layer 5, to the second region 7 of the adjacent electrically conductive layer 5. The electrically conductive wire 4 is a metal wire, and is connected in such a manner that the light emitting element 1 and the second region 7 which face each other are bridged so as to form a predetermined loop shape. For the electrically conductive wire 4 being a metal wire, for example a gold wire can be used. The electrically conductive wire 4 shown in FIGS. 4 to 6 include at both ends a first bonding portion 41 bonded to the light emitting element 1 and a second bonding portion 42 bonded to the second region 7.

The light emitting element 1 shown in FIG. 4 is connected through four electrically conductive wires 4 to the second region 7 facing the light emitting element 1. The four electrically conductive wires 4 are connected to four portions of the light emitting element from the second region 7 facing the light emitting element 1, and include long electrically conductive wires 4A connected at positions distant from the second region 7, and short electrically conductive wires 4B connected at positions close to the second region 7. By adjusting the lengths of a plurality of electrically conductive wires 4 in this way, the electrically conductive wires 4 can be reasonably bonded to bonding positions of the light emitting element 1 at different distances from the second region 7. The second bonding portions 42 of a plurality of electrically conductive wires 4 connected to the second region 7 are arranged in a line shape so as to be separated from one another in plan view. The bonding positions of a plurality of electrically conductive wires 4 in the second region 7 are adjusted so that the electrically conductive wires 4 do not come into contact with one another, and accordingly, a plurality of electrically conductive wires 4 does not interfere with one another.

Further, the electrically conductive wire 4 shown in FIGS. 4 to 6 is bent at both ends with a predetermined curvature radius to have a substantially trapezoidal shape as an overall shape. The electrically conductive wire 4 is bent at a first bending portion 43 provided on a side close to the first bonding portion 41, and bent at a second bending portion 44 provided on a side close to the second bonding portion 42. By providing a bending portion at both ends of the electrically conductive wire 4 in this way, the height of the electrically conductive wire 4 can be lowered to reduce disconnection of the electrically conductive wire 4 by thermal expansion of the light-transmissive resin 13 and stress from outside.

The illustrated electrically conductive wire 4 is connected from the side of the first bonding portion 41 bonded to the light emitting element 1 to the side of the second bonding portion 42 bonded to the second region 7. By connecting the electrically conductive wire 4 in this way, bondability of the electrically conductive wire 4 can be improved. The electrically conductive wire 4 may be connected from the side of the second bonding portion 42 bonded to the second region 7 to the side of the first bonding portion 41 bonded to the light emitting element 1. By connecting the electrically conductive wire 4, stress applied to the light emitting element 1 can be reduced, so that damage to the light emitting element 1, etc. can be reduced. The illustrated electrically conductive wire 4 is provided in such a manner that the height of the second bending portion 44 is greater than that of the first bending portion 43. In other words, the electrically conductive wire 4 is arranged in such a manner that the second bending portion 44 forms the top of the electrically conductive wire 4 in a state in which the light emitting element 1 and the second region 7 are connected to each other. By ensuring that the height of the bending portion on the side of a bonding portion that is bonded first is greater in this way, the first bonding portion 41 and the second bonding portion 42 can be easily bonded by the electrically conductive wire 4. The height from the upper surface of the second region 7 to the second bending portion 44 may be, for example, 0.1 mm to 0.3 mm.

Further, in the light emitting device according to this embodiment, a load on the electrically conductive wire 4 can be reduced by adjusting the positional relation between the second region 7 and the cylindrical lens portion 11 of the resin molded portion 3, and therefore the loop shape of the electrically conductive wire 4 may be a substantially triangular shape as shown in FIG. 7. In substantially triangular electrically conductive wires 4C and 4D, the height of a rising portion tends to be greater as compared to substantially trapezoidal electrically conductive wires 4A and 4B, but the substantially triangular electrically conductive wires can be made to have a simpler structure, and are therefore more easily bonded as compared to the substantially trapezoidal electrically conductive wires. The illustrated electrically conductive wires 4 also include long electrically conductive wires 4C connected at a position distant from the second region 7, and short electrically conductive wires 4D connected at a position close to the second region 7, and the number and the length of electrically conductive wires are not particularly limited.

When the electrically conductive wire 4 has a bending portion on the second bonding portion side as described above, the electrically conductive wire 4 may easily raised particularly at the bending portion, so that the electrically conductive wire may easily disconnected on the second bonding portion side, if the light-transmissive resin 13 is expanded by heat applied during the process for production of the light emitting device and during use of the light emitting device. Thus, increasing the height of the second region to which the second bonding portion is bonded, the amount of the light-transmissive resin provided below the electrically conductive wire, particularly below the electrically conductive wire on the second bonding portion side can be reduced, and therefore disconnection of the electrically conductive wire can be reduced. Further, by connecting the electrically conductive wire in the extending direction (first direction) of each cylindrical lens portion as in this embodiment, the bending portion can be provided at a distance from an area where the resin is thin, and thus the resistance to stress can be lower, i.e. a valley between cylindrical lens portions, and therefore disconnection of the electrically conductive wire can be reduced.

Resin Molded Portion 3

The resin molded portion 3 is formed of the light-transmissive resin 13 that seals a plurality of light emitting elements 1 arranged on the substrate 2, and the electrically conductive wire 4. As shown by broken lines in FIG. 4 and shown in FIG. 6, the resin molded portion 3 is formed in a shape in which a plurality of centrally projected semicylinder-shaped cylindrical lens portions 11 is arranged, and the groove portion 12 as a valley is formed between adjacent cylindrical lens portions 11.

Cylindrical Lens Portion 11

The cylindrical lens portion 11 has a substantially semicylinder shape with an outside surface having a predetermined curvature radius. More specifically, the cylindrical lens portion 11 has a flat-and-projected-type lens shape in which the upper part is shaped to conform to the outer peripheral surface of the cylinder, and the lower surface is a flat surface.

A plurality of cylindrical lens portions 11 is formed in such a manner that the extending directions of the cylindrical lens portions 11 are substantially parallel to one another. Each cylindrical lens portion 11 is provided with the light emitting element array 8 in which a plurality of light emitting elements 1 is arranged in a line. Further, the groove portion 12, which is a linkage portion between adjacent cylindrical lens portions 11 and which is formed between the cylindrical lens portions 11, is situated between adjacent light emitting element arrays 8. Preferably, the light emitting element array 8 is arranged in such a manner that the center of the light emitting element 1 is situated just below the top portion of the cylindrical lens portion 11 in lateral sectional view. Further, in each light emitting element array 8, the second region is situated between light emitting elements 1. Particularly, in the illustrated light emitting device 100, the second region 7 is provided in a direction crossing the groove portion 12 of the resin molded portion 3 in plan view. According to this structure, the connection direction of the electrically conductive wire 4 can be made substantially coincident with the extending direction of each cylindrical lens portion 11, so that the electrically conductive wire 4 can be arranged while avoiding the groove portion 12 formed on a surface of the resin molded portion 3. In other words, the electrically conductive wire 4 and the bonding portion between the electrically conductive wire 4 and the second region 7 can be arranged at the central part of the cylindrical lens portion 11 as shown in FIG. 6. Accordingly, above the electrically conductive wire 4, the light-transmissive resin 13 can be thickly formed, so that the electrically conductive wire 4 can be protected from being damaged by stress from outside.

Further, the connection direction of the electrically conductive wire 4 is made substantially coincident with the extending direction of each cylindrical lens portion 11, so that the amount (thickness) of the light-transmissive resin 13 on the electrically conductive wire 4 can be made more uniform as compared to, for example, a case where the connection direction of the electrically conductive wire 4 crosses the extending direction of each cylindrical lens portion 11. Accordingly, even when the light-transmissive resin 13 is thermally expanded or pressure is applied to the light-transmissive resin 13 from outside, stress is almost uniformly applied to one electrically conductive wire 4, and therefore the electrically conductive wire 4 is hardly disconnected.

As the light-transmissive resin 13 that forms the resin molded portion 3, a thermosetting resin or a thermoplastic resin, for example a silicone resin etc., can be used. The resin molded portion 3 can be formed by compression molding, transfer molding, casting molding or the like. For example, the upper surface of the substrate 2 on which light emitting elements 1 are mounted and to which the electrically conductive wire 4 is connected is closed by a mold having a plurality of recessed portions capable of forming the cylindrical lens portion 11, a liquid or gel light-transmissive resin is injected into a molding chamber formed by a mold, and the resin is then cured to form the resin molded portion 3. Alternatively, after adjustment of the material, viscosity and so on of the resin, the resin may be drawn in a line shape on each light emitting element array, and cured to form the resin molded portion 3.

Here, by adjusting the irregular state of a surface of the substrate, and the viscosity, temperature, injection pressure and so on of the resin in injection of the light-transmissive resin 13, generation of voids during molding can be reduced. For example, when the substrate 2 has a sufficient distance between the light emitting element 1 and the second region, the fluidity of the injected light-transmissive resin 13 in the molding chamber can be improved to reduce generation of voids. Prior to injecting the light-transmissive resin 13, the substrate 2 on which the light emitting elements 1 are mounted can be wetted with an organic solvent etc. to improve the fluidity of the light-transmissive resin 13 during molding. As the organic solvent, methyl ethyl ketone (MEK), acetone or the like can be used.

For example, in the resin molded portion 3, the height of the top of the cylindrical lens portion 11 may be 0.5 mm to 3.0 mm, and the height of the groove portion 12 may be 0.3 mm to 1.0 mm from the upper surface of the substrate 2.

Second Embodiment

Figure 8:
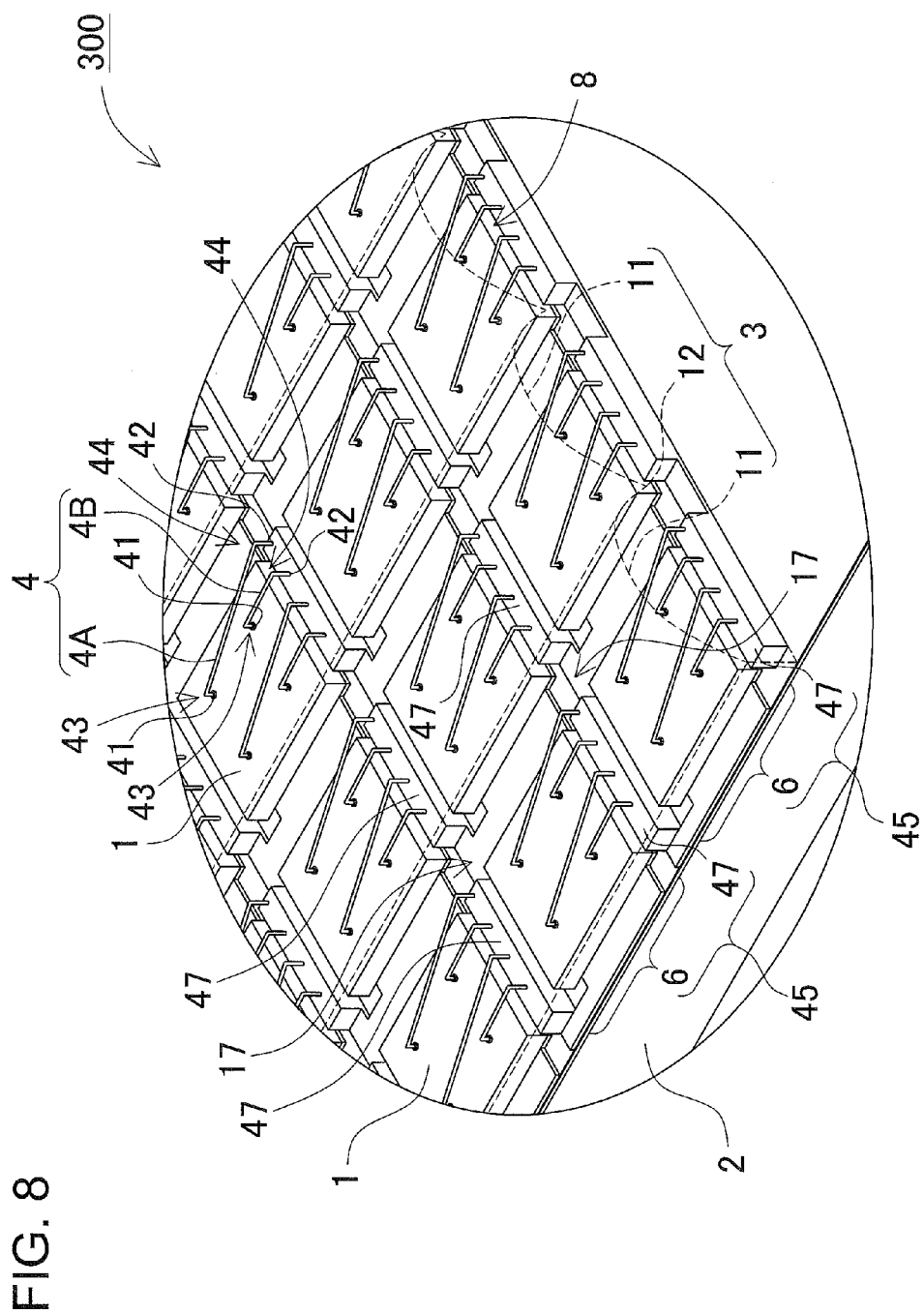
FIG. 8 is a schematic enlarged perspective view of a light emitting device according to a second embodiment.

Further, a light emitting device shown in FIG. 8 includes a second region 47 having a shape different from that of the second region 7 in the first embodiment. In an electrically conductive layer 45 shown in FIG. 8, the second region 47 is divided between adjacent light emitting element arrays 8. The illustrated second region 47 is provided with a recessed portion 17 formed with a height less than that of the second region 47 between adjacent light emitting element arrays 8, and is thereby divided into a plurality of second regions 47. A plurality of second regions 47 in the second embodiment is arranged in a straight line shape between adjacent light emitting element arrays 8.

In the electrically conductive layer 45 shown in FIG. 8, the bottom surface of a recessed portion 17 is substantially flush with the upper surface of the first region 6. This structure has such a characteristic that a gap formed between the lower end of a groove portion 12 and the electrically conductive layer 45 can be widened, and therefore at the time when a light-transmissive resin 13 is injected into a mold to form a resin molded portion 3, the injected resin can be made to smoothly flow in the mold, so that generation of voids can be reduced. This structure can ensure that the thickness of the light-transmissive resin 13 filled below the groove portion 12 of the resin molded portion 3 can be made uniform. Accordingly, the resin molded portion 3 can be stably formed on a substrate 2. Further, while the second region is structured so as to continuously extend over a plurality of light emitting element arrays 8 as shown in FIG. 4, a portion crossing the groove portion 12 of the resin molded portion 3 may be formed with a height less than that of a portion to which an electrically conductive wire 4 is bonded in plan view. In other words, only a portion of the second region near a region crossing the groove portion 12 of the resin molded portion 3 may have a height less than that of a portion near a region to which the electrically conductive wire 4 is bonded. This structure can also ensure that the light-transmissive resin 13 filled below the groove portion 12 of the resin molded portion 3 can be thickened.

Third Embodiment

Figure 9:
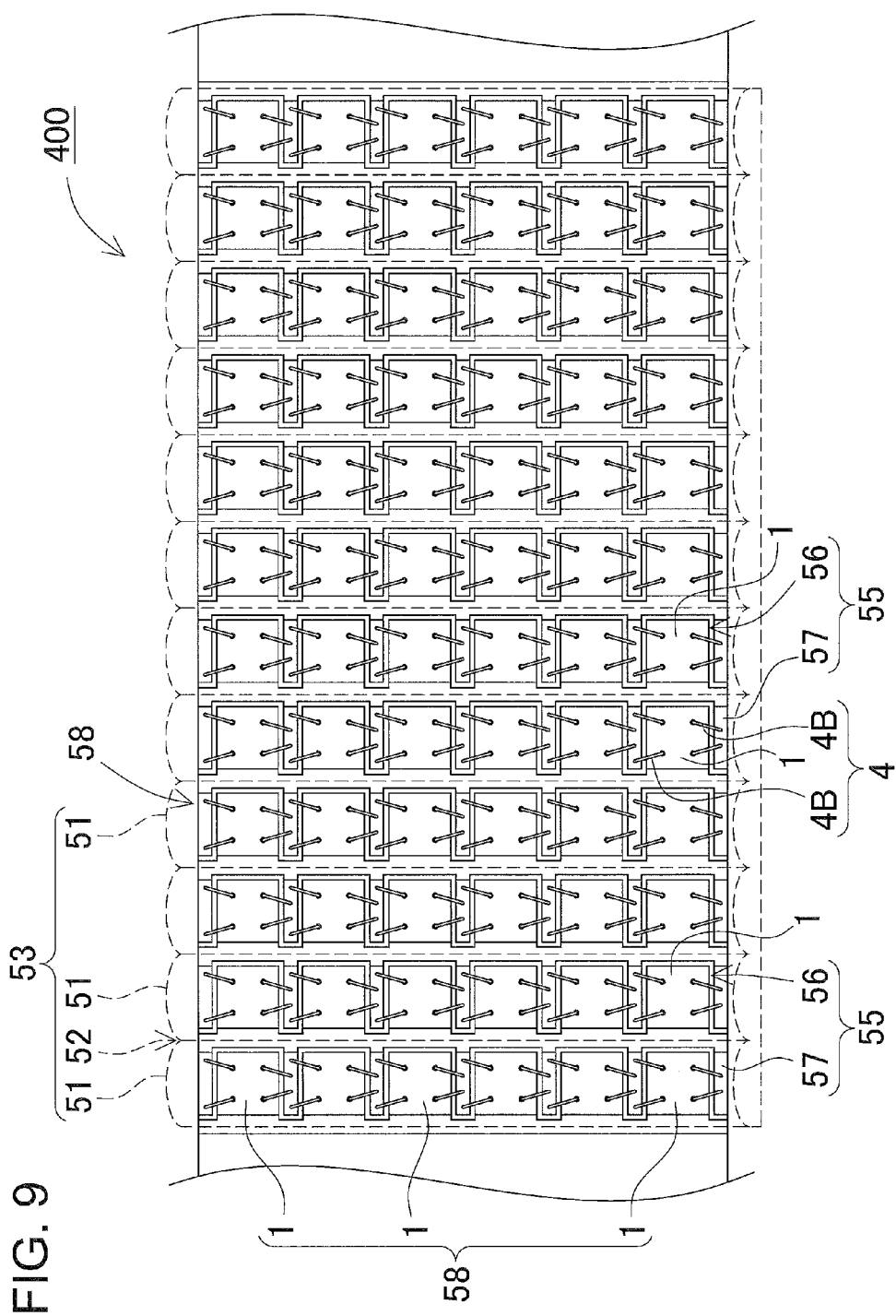
FIG. 9 is a schematic plan view showing an array of a plurality of light emitting elements of a light emitting device according to a third embodiment.

The above embodiments show an example in which a plurality of light emitting elements 1 that form each light emitting element array 8 are connected in series, but in a light emitting device, a plurality of light emitting elements 1 that forms each light emitting element array 58 can also be connected in parallel as shown in FIG. 9. In an illustrated light emitting device 400, light emitting element arrays 58 connected in parallel are each covered with a cylindrical lens portion 51 of a resin molded portion 53. In the light emitting device 400 shown in FIG. 9, six light emitting elements 1 that form one light emitting element array 58 situated in one cylindrical lens portion 51, among a plurality of light emitting elements 1 connected in series in 12 lines and in parallel in 6 lines, are connected in parallel. Further, the light emitting device 400 is also arranged such that the light emitting element array 58 is formed by a plurality of light emitting elements 1 connected in parallel, and the light emitting element array 58 is situated in one cylindrical lens portion 51.

In the light emitting device 400 shown in FIG. 9, electrically conductive layers 55 extending in a second direction are arranged in a plurality of rows in a first direction, and the light emitting elements 1 arranged on each electrically conductive layer 55 are electrically connected through the electrically conductive wire 4 to the adjacent electrically conductive layer 55 to connect a plurality of rows of light emitting elements 1 in series. Each electrically conductive layer 55 is formed in a such a comb blade shape that a first region 56 on which the light emitting elements 1 are mounted and a second region 57 to which the electrically conductive wire 4 is bonded are extended in opposite directions. In the electrically conductive layer 55 shown in FIG. 9, a plurality of first regions 56 is extended upward in the drawing while having a rectangular shape on which the light emitting elements 1 can be arranged, and a gap is provided between adjacent first regions 56 to form a comb blade shape. In the electrically conductive layer 55, a plurality of second regions 57 is extended downward in the drawing while having a rectangular shape extended in the first direction on a lateral edge on a side opposite to a side on which first regions 56 are provided, and a gap is provided between adjacent second regions 57 to form a comb blade shape. In the electrically conductive layer 55, the first region 56 and the second region 57 which are extended in opposite directions are provided at mutually shifted directions in FIG. 9, and in mutually adjacent electrically conductive layers 55, the second region 57 of one electrically conductive layer 55 is situated between the first regions 56 of the other electrically conductive layer 55. A predetermined spacing is provided between the first region 56 and the second region 57 to avoid contact.

In the electrically conductive layer 55 shown in FIG. 9, a plurality of first regions 56 and second regions 57 are alternately arranged in one light emitting element array 58. The light emitting element 1 is mounted in each first region 56, and bonded through the electrically conductive wire 4 to the second regions 57 arranged on both sides of the light emitting element 1. In the light emitting device 400, the second region 57 is arranged between the light emitting elements 1 in each of the light emitting element arrays 58. The second region 57 extends in a direction crossing the light emitting element array 58, and is arranged in a direction crossing a groove portion 52 of the resin molded portion 53.

In the light emitting element 1 shown in FIG. 9, electrically conductive wires 4B are bonded to four portions of the upper surface thereof as with the foregoing light emitting element 1, and two electrically conductive wires 4B are arranged in each of the second regions 57 situated on both sides of the light emitting element 1. This structure can ensure that all four electrically conductive wires 4B can be connected with substantially the same length in a well-balanced manner. Particularly, by reducing the length of the electrically conductive wire 4B, the area of a portion covering the light emitting element 1 can be minimized while influences of the resin are kept minimum. In this light emitting device, connection can be established through electrically conductive wires having different lengths in the same way as described above. Here, for one light emitting element, four electrically conductive wires are connected to one second region facing the light emitting element.

In the above embodiments, a plurality of light emitting elements are longitudinally and laterally arranged in a matrix shape on a substrate, but a plurality of light emitting elements can also be arrayed in a zigzag manner such that a plurality of light emitting element arrays that is mutually adjacently arranged is shifted in the row direction. In this zigzag array, for example, light emitting elements in adjacent light emitting element arrays can be alternately shifted in position such that the light emitting elements in the adjacent light emitting element arrays are each situated at a position the half way of the pitch between adjacent two of a plurality of light emitting elements that forms each light emitting element array.

Fourth Embodiment

Figure 10:
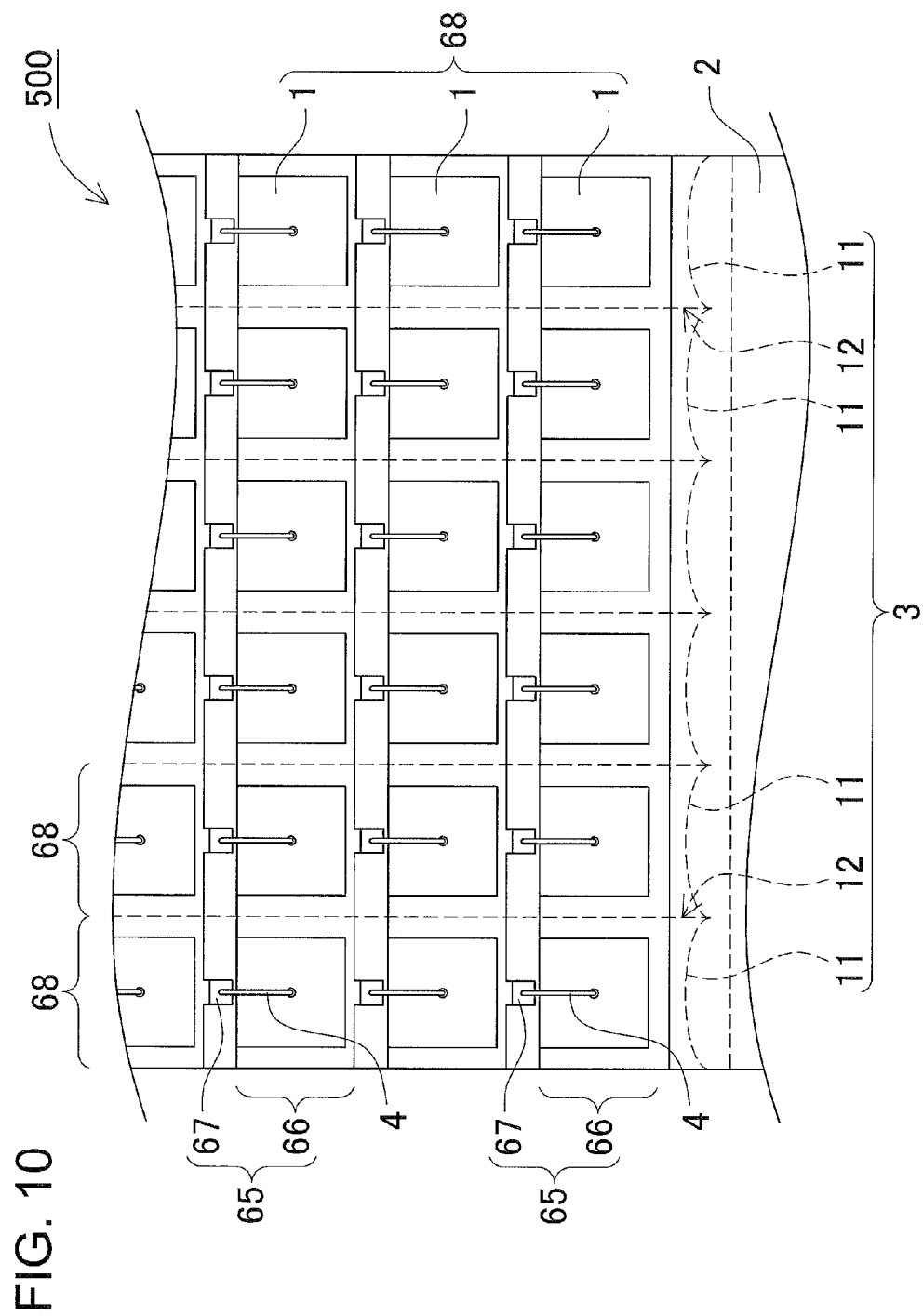
FIG. 10 is a schematic plan view showing an array of a plurality of light emitting elements of a light emitting device according to a fourth embodiment.

Further, FIG. 10 shows one example of a light emitting device 500 in which upper surface electrodes of light emitting elements 1 are connected to a second region by one electrically conductive wire 4. In the light emitting device 500 shown in FIG. 10, the upper surface electrodes of the light emitting elements 1 mounted on a first region 66 of an electrically conductive layer 65 are connected to a second region 67 of the adjacent electrically conductive layer 65 by one electrically conductive wire 4. In the electrically conductive layer 65 shown in FIG. 10, the first region 66 is formed in a belt shape extending in a second direction, and the second region 67 is provided at a part of one lateral edge (lower side in the drawing) of the first region 66. In the illustrated electrically conductive layer 65, the second region 67 is provided at a position opposite to the central part of the light emitting element 1 mounted on the first region 66. The second region 67 is arranged at the first region 66 of the adjacent electrically conductive layer 65 and the light emitting element 1 mounted thereon.

The second region 67 is formed in such a size and shape that one electrically conductive wire 4 can be bonded to the second region 67. The second region 67 has a height greater than that of the first region 66. Preferably, the height of the second region 67 is made almost equal to or slightly greater than that of the upper surface of the light emitting element 1. Thus, the electrically conductive wire 4 can be easily connected to the second region 67. The second region 67 shown in FIG. 10 has a rectangular outer shape, but the second region may have a circular, elliptical, oblong or polygonal outer shape. The width of the second region can be increased, so that a plurality of electrically conductive wires are used to connect one light emitting element to the electrically conductive layer as described above.

In the light emitting device 500 in FIG. 10, electrically conductive layers 65 extending in the second direction are arranged in a plurality of rows in the first direction, and the light emitting element 1 mounted on the first region 66 of each electrically conductive layer 65 is electrically connected through the electrically conductive wire 4 to the second region 67 of the adjacent electrically conductive layer 65 to connect a plurality of rows of light emitting elements 1 in series similar to the light emitting device in FIG. 8. In this state, a plurality of light emitting elements 1 arrayed in the first direction is connected to one another in series to form a light emitting element array 68. Further, a cylindrical lens portion 11 is situated on the light emitting element array 68 formed so as to extend in the first direction. In other words, the light emitting element arrays 68 formed in a line are arranged, respectively, in the cylindrical lens portions 11 formed in a plurality of rows (six rows in FIG. 10). In each light emitting element array 68, the second region 67 is situated between the light emitting elements 1. In the light emitting device 500, the electrically conductive wire 4 is arranged on an area just below the top portion of the cylindrical lens portion 11 where a light-transmissive resin has the greatest thickness. Thus, the electrically conductive wire 4 can be reduced from being damaged by stress from outside. Further, in the light emitting device 500, the ratio of the second region 67 to the whole electrically conductive layer 65 can be decreased, and therefore during formation of a resin molded portion 3, the fluidity of an injected light-transmissive resin 13 in a molding chamber can be improved to more effectively reduce generation of voids. Further, it may be able to reduce material costs because the range of the second region is narrow.

Further, a ball portion formed at the tip of the electrically conductive wire at the time of ball-bonding the electrically conductive wire to the electrically conductive layer is enlarged, and the electrically conductive wire is bonded to the electrically conductive layer with the ball portion interposed therebetween, so that the bonding portion of the electrically conductive wire can be raised. In this structure, a raised portion formed by ball-bonding the electrically conductive wire directly to the upper surface of the first region on which the light emitting element is mounted, so that the electrically conductive wire is bonded at a position higher than the first region, can be set as a second region. In other words, in this structure, a raised portion formed by ball bonding for bonding the electrically conductive wire to the electrically conductive layer can be set as a second region to bond the electrically conductive wire at a position higher than the first region. In this structure, a structure for situating the second region at a position higher than the first region can be made simple, and therefore the production process can be simplified.

Light emitting devices according to the embodiments of the present invention can be suitably used in, for example, light sources for illumination, backlight light sources for LED displays, liquid crystal display devices and so on, and light sources for signals, illumination-type switches, various kinds of sensors, various kinds of indicators, and other general consumer products.

According to the configuration described above, there can be provided a light emitting device with high reliability, which has a structure in which light emitting elements and an electrically conductive wire are covered with a light-transmissive resin having a plurality of cylindrical lens portions arranged, so that disconnection of the electrically conductive wire can be avoided.

Obviously, numerous modifications and variations of the present invention are possible in light of the above teachings. It is therefore to be understood that within the scope of the appended claims, the invention may be practiced otherwise than as specifically described herein.

What is claimed is:
1. A light emitting device comprising:
a plurality of light emitting elements;
a substrate including a plurality of electrically conductive layers each having a first region in which the light emitting elements are arranged, and a second region connected to the first region and provided at a position higher than the first region;
an electrically conductive wire that electrically connects the light emitting elements arranged on the electrically conductive layer and the second region of the adjacent electrically conductive layer; and
a resin molded portion formed of a light-transmissive resin that seals the light emitting elements and the electrically conductive wire on the substrate, wherein
the resin molded portion has a shape in which a plurality of centrally projected cylindrical lens portions is aligned, and in each of the cylindrical lens portions, the plurality of light emitting elements is arranged in a line shape to form a light emitting element array; and
the second region is arranged between the light emitting elements in the light emitting element array.

2. The light emitting device according to claim 1, wherein the plurality of electrically conductive layers are arranged so as to be separated from one another, and the mutually adjacent electrically conductive layers are connected to each other in series through an electrically conductive wire connected to the light emitting elements arranged in the first region of one electrically conductive layer, and the second region of the other electrically conductive layer.

3. The light emitting device according to claim 1, wherein in the electrically conductive layer, the plurality of light emitting elements is arranged in a line shape in the first region, and the plurality of light emitting elements arranged in the first region is connected to one another in parallel.

4. The light emitting device according to claim 1, wherein the second region is provided so as to extend in a direction crossing an array direction of the light emitting elements in the light emitting element array.

5. The light emitting device according to claim 1, wherein
the resin molded portion has a groove portion formed between the adjacent cylindrical lens portions,
the second region is provided so as to extend over the mutually adjacent light emitting element arrays, and
the second region and the groove portion cross each other in plan view.

6. The light emitting device according to claim 1, wherein
the resin molded portion has a groove portion formed between the adjacent cylindrical lens portions, and
in the electrically conductive layer, a portion overlapping the groove portion is formed with a height less than that of the second region in plan view.

7. The light emitting device according to claim 1, wherein the light emitting elements are electrically connected to the second region through the plurality of electrically conductive wires.

8. The light emitting device according to claim 7, wherein
the plurality of electrically conductive wires each include a second bonding portion that is bonded to the second region, and
the second bonding portion is arranged in a line shape in an extending direction of the second region in plan view.

9. The light emitting device according to claim 1, wherein
the plurality of light emitting elements is arranged in a matrix shape such that a plurality of light emitting element arrays each arranged in one row is arranged, and
the plurality of cylindrical lens portions is formed in a parallel manner so as to be each situated on the light emitting element array.

10. The light emitting device according to claim 1, wherein the second region is provided with a height equal to or greater than that of the upper surface of the light emitting element.

11. The light emitting device according to claim 1, wherein the electrically conductive layer includes a first electrically conductive layer that forms the first region, a part of the first electrically conductive layer has an insulating layer thereon, and a second electrically conductive layer is provided on the insulating layer to form the second region.

12. The light emitting device according to claim 1, wherein the electrically conductive layer includes a metal layer that forms the first region, and the metal layer is partially thickened to form the second region.

13. The light emitting device according to claim 1, wherein the electrically conductive wire has a substantially trapezoidal shape as an overall shape with a bending portion provided by subjecting the electrically conductive wire to bending processing at both ends with a predetermined curvature radius.

14. The light emitting device according to claim 1, wherein
the electrically conductive wire has at both ends a first bonding portion bonded to the light emitting element and a second bonding portion bonded to the second region, and is provided with a second bending portion by subjecting the electrically conductive wire to bending processing on the second bonding portion side with a predetermined curvature radius, and
the second bending portion forms a top portion of the electrically conductive wire.

15. The light emitting device according to claim 1, wherein the light emitting element array is formed by connecting the plurality of light emitting elements in series.

16. The light emitting device according to claim 1, wherein the light emitting element array is formed by connecting the plurality of light emitting elements in parallel.

17. The light emitting device according to claim 1, wherein the light emitting element emits ultraviolet light.

* * * * *